United States Patent
Farkas et al.

(10) Patent No.: US 11,677,432 B2
(45) Date of Patent: Jun. 13, 2023

(54) SYSTEM AND METHOD TO PREVENT CONDUCTIVE ANODIC FILAMENT FORMATION IN PRINTED CIRCUIT BOARDS

(71) Applicant: DELL PRODUCTS, LP, Round Rock, TX (US)

(72) Inventors: Sandor Farkas, Round Rock, TX (US); Bhyrav Mutnury, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/405,485

(22) Filed: Aug. 18, 2021

(65) Prior Publication Data

US 2023/0059860 A1 Feb. 23, 2023

(51) Int. Cl.
*H04B 1/38* (2015.01)
*H04B 1/40* (2015.01)
*H03F 3/45* (2006.01)

(52) U.S. Cl.
CPC ........... *H04B 1/40* (2013.01); *H03F 3/45475* (2013.01)

(58) Field of Classification Search
CPC ..... H04B 1/02; H04B 1/04; H04B 1/06; H04B 1/16; H04B 1/18; H04B 1/40; H03F 3/45475
See application file for complete search history.

(56) References Cited

U.S. PATENT DOCUMENTS

| | | |
|---|---|---|
| 8,974,888 B2 | 3/2015 | Balcome et al. |
| 9,048,017 B2 * | 6/2015 | Kireev ............... H01F 17/0013 |
| 9,946,322 B2 * | 4/2018 | Yehezkely ............ G06F 1/3243 |
| 10,631,407 B1 | 4/2020 | Oliver et al. |
| 2022/0286098 A1 * | 9/2022 | Zhao ................... H03F 3/45076 |

\* cited by examiner

*Primary Examiner* — Tuan Pham
(74) *Attorney, Agent, or Firm* — Larson Newman, LLP

(57) ABSTRACT

An information handing system includes a transmitter, a receiver, and a differential signal channel. The transmitter provides a differential signal on a pair of differential outputs. The receiver receives the differential signal on a pair of differential inputs. The differential signal channel carries the differential signal from the differential outputs to the differential inputs. The differential signal is provided on the differential signal channel as a voltage swing between a first positive voltage and a first negative voltage with reference to a ground plane of the information handling system.

18 Claims, 5 Drawing Sheets

SYSTEM AND METHOD TO PREVENT CONDUCTIVE ANODIC FILAMENT FORMATION IN PRINTED CIRCUIT BOARDS

FIELD OF THE DISCLOSURE

This disclosure generally relates to information handling systems, and more particularly relates to providing bend radius insensitive impedance in a high-speed data cable for an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handing system may include a transmitter, a receiver, and a differential signal channel. The transmitter may provide a differential signal on a pair of differential outputs. The receiver may receive the differential signal on a pair of differential inputs. The differential signal channel may carry the differential signal from the differential outputs to the differential inputs. The differential signal may be provided on the differential signal channel as a voltage swing between a first positive voltage and a first negative voltage with reference to a ground plane of the information handling system.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
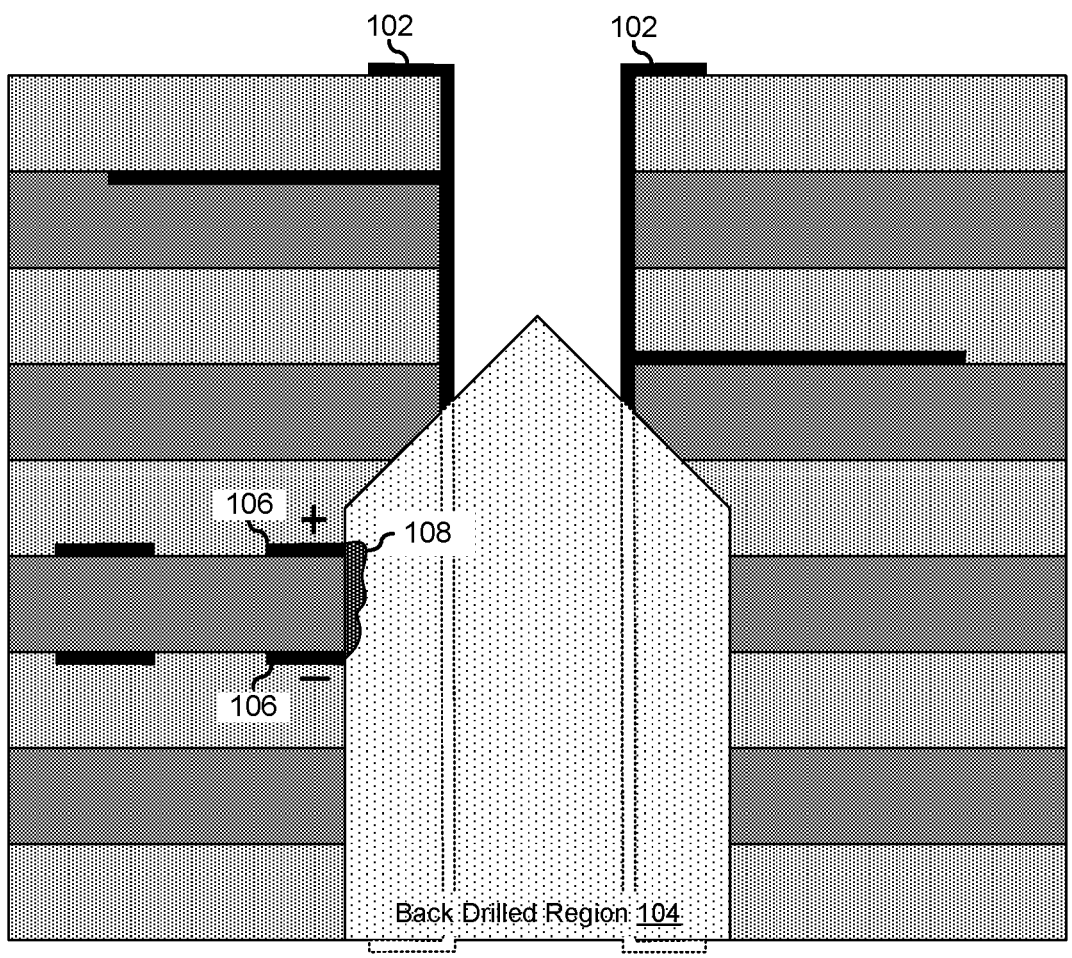
FIG. 1 illustrates a printed circuit board (PCB) according to the prior art.

FIG. 1 illustrates a printed circuit board (PCB) 100 as is known in the art. PCB 100 includes a circuit via 102. In fabricating PCB 100, circuit traces are patterned on metal layers formed on the surfaces of layers of a core material (illustrated as light stipeled layers) and the core layers are sandwiched together with layers of a prepreg material (illustrated as darker stipeled layers). To interconnect circuit traces on different metal layers, a hole is drilled at a via pad that terminates each trace on each layer, and the hole is plated with a conductive material, thereby interconnecting the circuit traces. The plated via typically includes excess plating the extends beyond the layers to be interconnected. That is, the plated via extends from a top surface of the PCB to a bottom surface. In high speed circuits, such excess plating is experienced as an open circuit stub that produces reflections in the signals carried by the traces, resulting in poor signal integrity. To mitigate the signal integrity issues caused by the excess plating of the vias, a back drilling process is performed to eliminate the excess plating.

Via 102 is illustrated as including a circuit trace on a second metal layer of PCB 100 and another circuit trace is shown on a fourth metal layer. Via 102 is further illustrated as having been back drilled 104. It has been understood by the inventors of the current disclosure that, as the density of routing on the metal layers of PCBs increases, and the pin density of integrated circuits affixed to the PCBs increases, the likelihood that the back drilling process inadvertently exposes portions of other traces or antipads in the metal layers through which the back drilling is performed likewise increases. This may particularly result when trace patterning tolerances, drill mis-alignment tolerances, and layer mis-alignment, or registration, tolerances are taken into consideration.

A pair of circuit traces 106 are shown on the sixth and seventh metal layers of PCB 100 that have been exposed by back-drilling via 102. It is known that when the copper of the metal layers is exposed to the atmosphere, the presence of a voltage between metal layers results in a galvanic growth of conductive anodic filaments (CAFs) between positively charged traces and negatively charged traces. The CAFs may grow to the extent that they completely bridge the core or prepreg layers separating the traces, resulting in short circuits between the traces, which in turn may lead to a crash of an information handling system instantiated on the PCB or other catastrophic failures. Here, a CAF 108 is shown as having grown between the positive and negative traces 106.

It has been understood that the growth of CAFs is accelerated with higher temperature, humidity, and voltage levels. A common solution is to fill the back-drilled regions with a resin material, but the added process step is very costly, and is therefore not a desirable solution. It has been further understood that the typical integrated circuit device installed onto a PCB is powered by connecting the power pins of the integrated circuit between a positive voltage rail and a ground plane, and that the traces of high-speed data communication interfaces are switched between a positive voltage level and the ground voltage level. That is, the traces of high-speed data communication interfaces have a positive voltage bias that encourages the growth of CAFs between the signal traces and the ground. Further, even when a high-speed data communication interface is a differential signal interface, both legs of the signal trace pair are positively biased.

Figure 2:
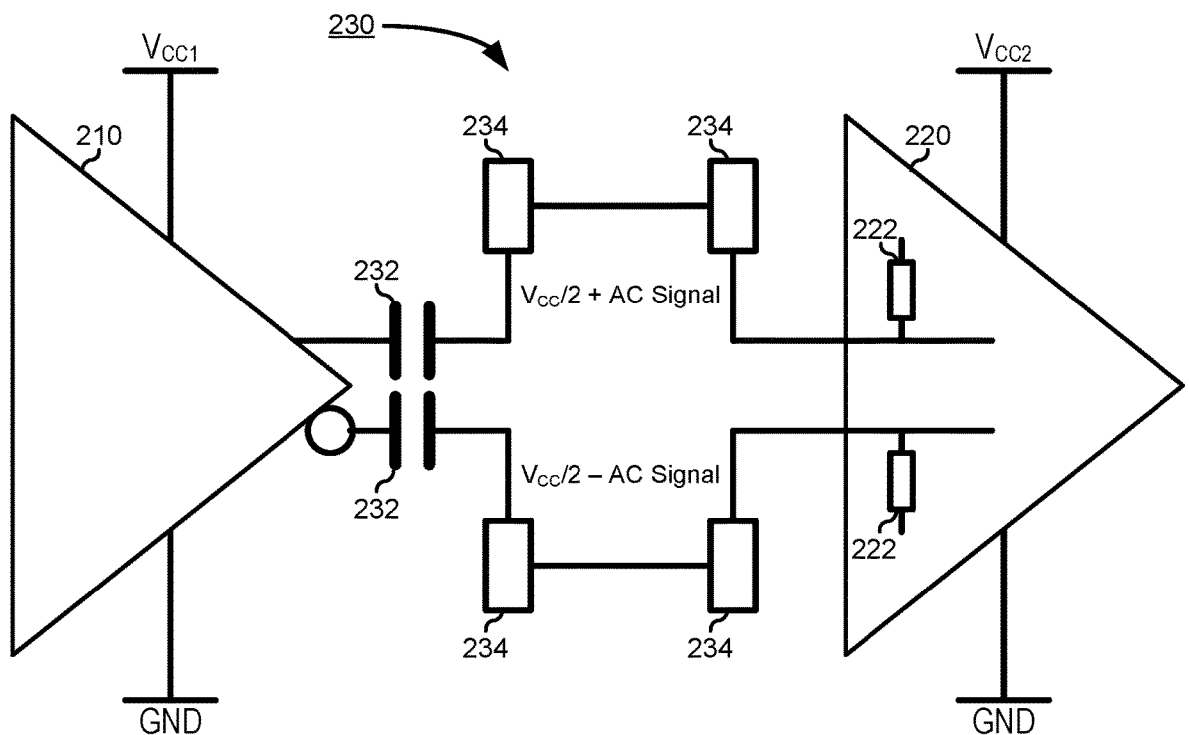
FIG. 2 illustrates a high-speed data communication interface according to the prior art.
Figure 2:
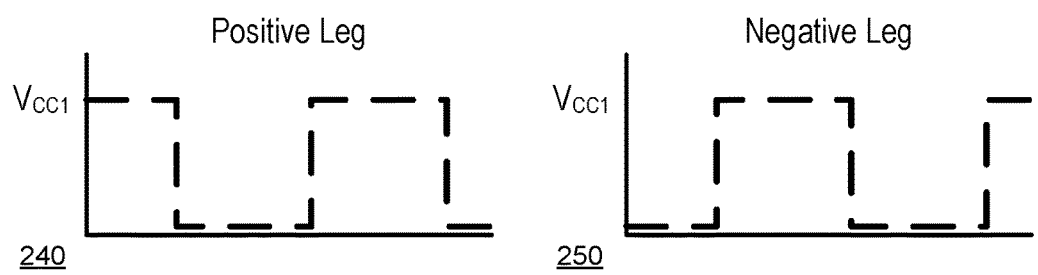

FIG. 2 illustrates a typical high-speed data communication interface circuit 200 as may be instantiated on a PCB. Circuit 200 includes a transmitter 210, a receiver 220, and a trace pair structure 230. Transmitter 210 and receiver 220 represent integrated circuits soldered to the PCB, while trace pair structure 230 is implemented in the pattering of the metal layers and interconnecting vias of the PCB. Transmitter 210 is powered by a first power plane ($V_{CC1}$), and receiver 220 is powered by a second power plane ($V_{CC2}$). Receiver 220 includes pull-up resistors 222. Trace pair structure 230 includes blocking capacitors 232 and vias 334. The connections between transmitter 210 and trace pair structure 230, between the trace pair structure and receiver 220, and between the elements of the trace pair structure may further include strip line traces, microstrip traces, or other metal layer interconnections as needed or desired. Blocking capacitors 232 are soldered onto the PCB, and operate to enable transmitter 210 to center the transmitted signal on the first power plane ($V_{CC1}$), and to enable receiver 220 to center the received signal on the second power plane ($V_{CC2}$), thereby isolating the power planes from each other so that the transmitter and the receiver may operate at different operating voltages. As such, pull-up resistors 222 are needed to pull the receiver-side signal to $V_{CC2}$, thereby enabling interoperability between transmitter 210 and receiver 220, in spite of the different operating voltages.

FIG. 2 further illustrates the positive leg signaling levels 240 and the negative leg signaling levels 250 for circuit 200. It will be noted that both positive leg signaling levels 240, and the negative leg signaling levels 250 operate with positive voltages at all times, with an average voltage level ($V_{RMS1}$) of $V_{CC1}/2$ for traces and elements of trace pair structure 230 that are before capacitors 232, and with an average voltage level ($V_{RMS2}$) of $V_{CC2}/2$ for traces and elements of the trace pair structure that are after the capacitors. Thus, all of the circuit traces of trace pair structure 230 operate with an inherent DC voltage bias and are therefore susceptible to the formation of CAFs if any portion of the circuit traces are exposed by the back drilling of other adjacent vias.

Figure 3:
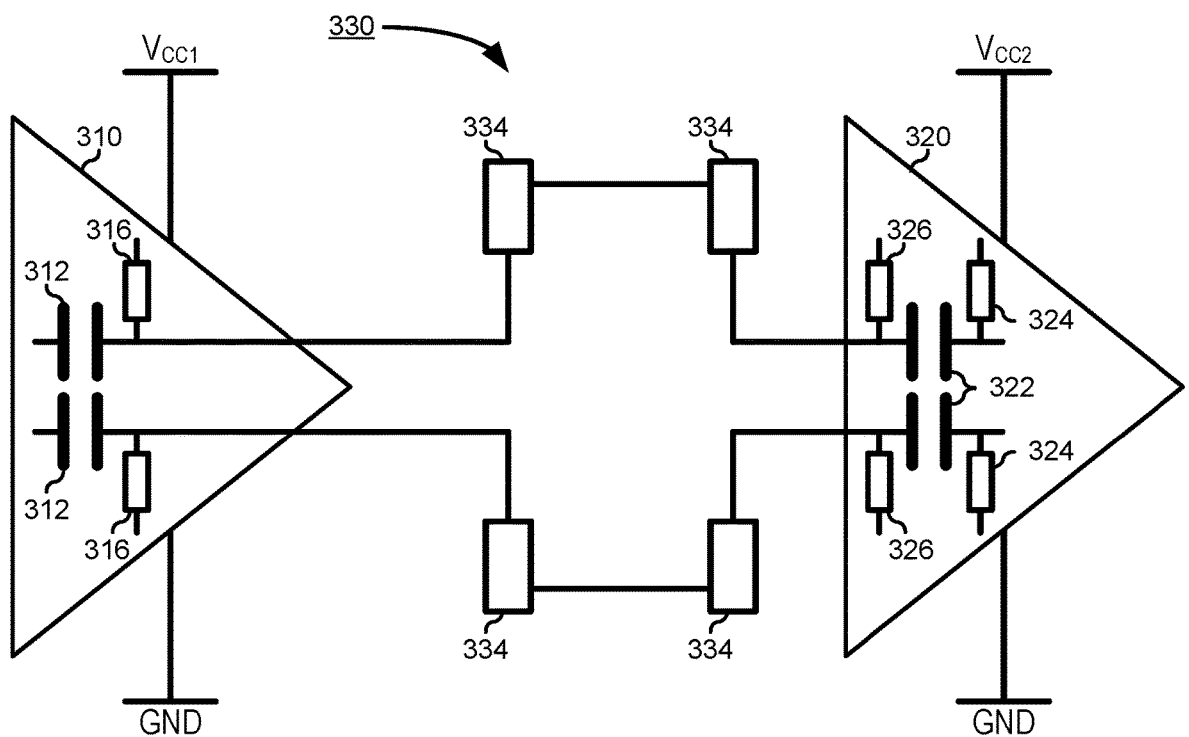
FIG. 3 illustrates a high-speed data communication interface according to an embodiment of the current disclosure.
Figure 3:
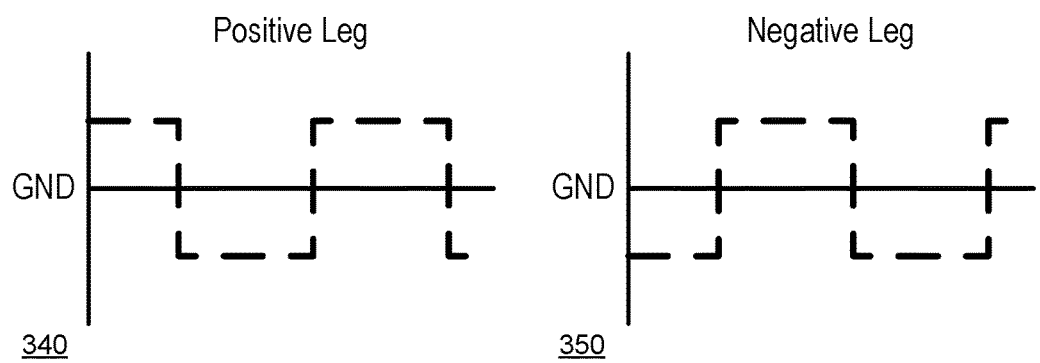

FIG. 3 illustrates a high-speed data communication interface circuit 300 as may be instantiated on a PCB according to an embodiment of the current disclosure. Circuit 300 includes a transmitter 310 similar to transmitter 210, a receiver 320 similar to receiver 220, and a trace pair structure 330 similar to trace pair structure 230. Transmitter 310 includes blocking capacitors 312 similar to blocking capacitors 232, and pull-down resistors 316. Receiver 320 includes blocking capacitors 322, pull-up resistors 324, and pull-down resistors 326. Trace pair structure 330 includes vias 334. The connections between transmitter 310 and trace pair structure 330, between the trace pair structure and receiver 320, and between the elements of the trace pair structure will be understood to further include strip line traces, microstrip traces, or other metal layer interconnections, as needed or desired. Blocking capacitors 312 operate similarly in circuit 300 to blocking capacitors 232 in circuit 200, enabling transmitter 310 to center the transmitted signal on the first power plane ($V_{CC1}$), thereby isolating trace pair structure 330 the first power plane ($V_{CC1}$).

In addition, blocking capacitors 322 further isolate trace pair structure 330 from the second power plane ($V_{CC2}$). In this way, the signaling on trace pair structure 330 is permitted to float. Pull-down resistors 316 and 326 are added to prevent trace pair structure 330 from being charged up to a DC voltage from leakage paths to either the first power plane ($V_{CC1}$) or the second power plane ($V_{CC2}$). As illustrated, circuit 300 includes both pull-down resistors 316 and 326. However, it will be understood that such pull-down resistors may be provided in only a transmitter, or in only a receiver, as needed or desired. Finally, pull-up resistors 324 enable receiver 320 to center the received signal on the second power plane ($V_{CC2}$), and the interoperability between transmitter 310 is maintained. Transmitter 310 may include a differential signal source to provide the differential signal to capacitors 312, and that receiver 320 may include a differential signal sink to receive the differential signal from capacitors 322.

FIG. 3 further illustrates the positive leg signaling levels 340 and the negative leg signaling levels 350 for circuit 300. It will be noted that both positive leg signaling levels 340, and the negative leg signaling levels 350 operate around the ground plane as the reference voltage, so that the average voltage level ($V_{RMS}$) of the entire length of trace pair structure 330 is zero (0). In particular, all of the circuit traces of trace pair structure 330 operate with no inherent DC voltage bias and are therefore much less susceptible to the formation of CAFs if any portion of the circuit traces are exposed by the back drilling of other adjacent vias.

In removing the capacitors from the typical high-speed data communication interface circuit from the PCB to the transmitter, as illustrated in FIG. 3, the need for capacitor mounting pads, and the associated circuit traces and vias that the capacitor mounting pads necessitate, is eliminated. As such, the signal integrity of the high-speed data communication interface circuit of the current embodiment will be expected to be improved due to the reduced number of solder connections, vias, and impedance transitions, as compared with the high-speed data communication interface circuit of the prior art, as illustrated in FIG. 2. Further, the elimination of the capacitor mounting pads and the associated circuit traces and vias results in more room for other devices vias and circuit traces on the PCB.

Figure 4:
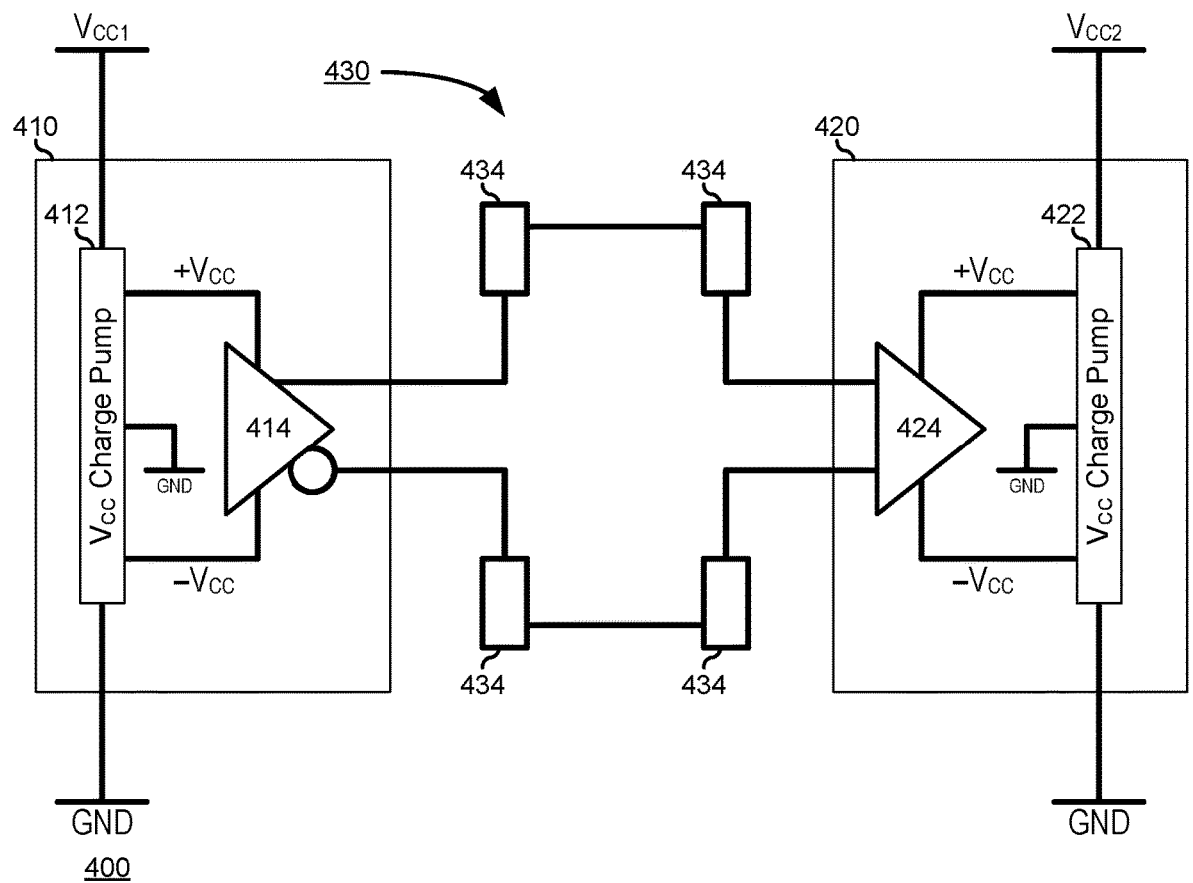
FIG. 4 illustrates a high-speed data communication interface according to another embodiment of the current disclosure.
Figure 4:
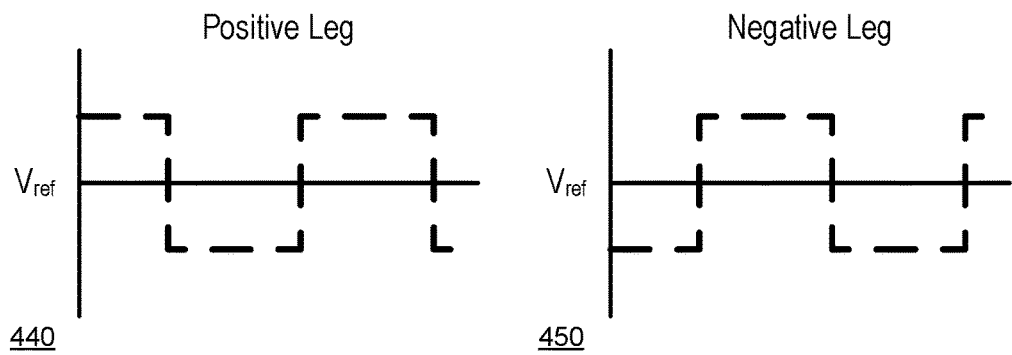

FIG. 4 illustrates a high-speed data communication interface circuit 400 similar to high-speed data communication interface circuit 300, as may be instantiated on a PCB according to an embodiment of the current disclosure. Circuit 400 includes a transmitter IC 410, a receiver 420, and a trace pair structure 430 similar to trace pair structure 230. Transmitter IC 410 includes a charge pump 412 and a transmitter 414 similar to transmitter 310. Receiver IC 420 includes a charge pump 422 and a receiver 424 similar to receiver 420. Trace pair structure 430 includes vias 434. The connections between transmitter IC 410 and trace pair structure 430, between the trace pair structure and receiver IC 420, and between the elements of the trace pair structure will be understood to further include strip line traces, microstrip traces, or other metal layer interconnections, as needed or desired.

Charge pump 412 converts the first power plane ($V_{CC1}$) to a differential voltage pair ($+V_{CC}$ and $-V_{CC}$) centered on the ground plane (GND). Transmitter 414 is powered by the differential voltage pair ($+V_{CC}$ and $-V_{CC}$) and the differential signal provided by the transmitter is thus isolated from the first power plane ($V_{CC1}$) and centered on the ground plane (GND). Similarly, charge pump 422 converts the second power plane ($V_{CC2}$) to the same differential voltage pair ($+V_{CC}$ and $-V_{CC}$) centered on the ground plane (GND), and transmitter 424 is powered by the differential voltage pair ($+V_{CC}$ and $-V_{CC}$) such that the differential signal received by the receiver is also isolated from the second power plane ($V_{CC2}$) and centered on the ground plane (GND). In this way, the signaling on trace pair structure 430 is tied to the differential voltage pair ($+V_{CC}$ and $-V_{CC}$) and firmly centered on the ground plane (GND), with no need for additional decoupling capacitors or pull-down resistors. Likewise receiver IC 420 has no need for pull-up resistors.

FIG. 4 further illustrates the positive leg signaling levels 440 and the negative leg signaling levels 450 for circuit 400. It will be noted that both positive leg signaling levels 440, and the negative leg signaling levels 450 operate around the ground plane as the reference voltage, so that the average voltage level ($V_{RMS}$) of the entire length of trace pair structure 430 is zero (0). In particular, all of the circuit traces of trace pair structure 430 operate with no inherent DC voltage bias and are therefore much less susceptible to the formation of CAFs if any portion of the circuit traces are exposed by the back drilling of other adjacent vias.

In removing the capacitors from the typical high-speed data communication interface circuit from the PCB, and removing the blocking capacitors, pull-up resistors and pull-down resistors as illustrated in FIG. 4, the need is eliminated for capacitor mounting pads and the associated circuit traces and vias that the capacitor mounting pads necessitate on the PCB. Again, the signal integrity of the high-speed data communication interface circuit of the current embodiment will be expected to be improved due to the reduced number of solder connections, vias, and impedance transitions, as compared with the high-speed data communication interface circuit of the prior art, as illustrated in FIG. 2. Here too, the elimination of the capacitor mounting pads and the associated circuit traces and vias results in more room for other devices vias and circuit traces on the PCB results in more room for other devices vias and circuit traces on the PCB. Finally the removal of the blocking capacitors, the pull-up resistors, and the pull-down resistors from the transmitter and receiver ICs results in more room for other devices in the ICs.

Figure 5:
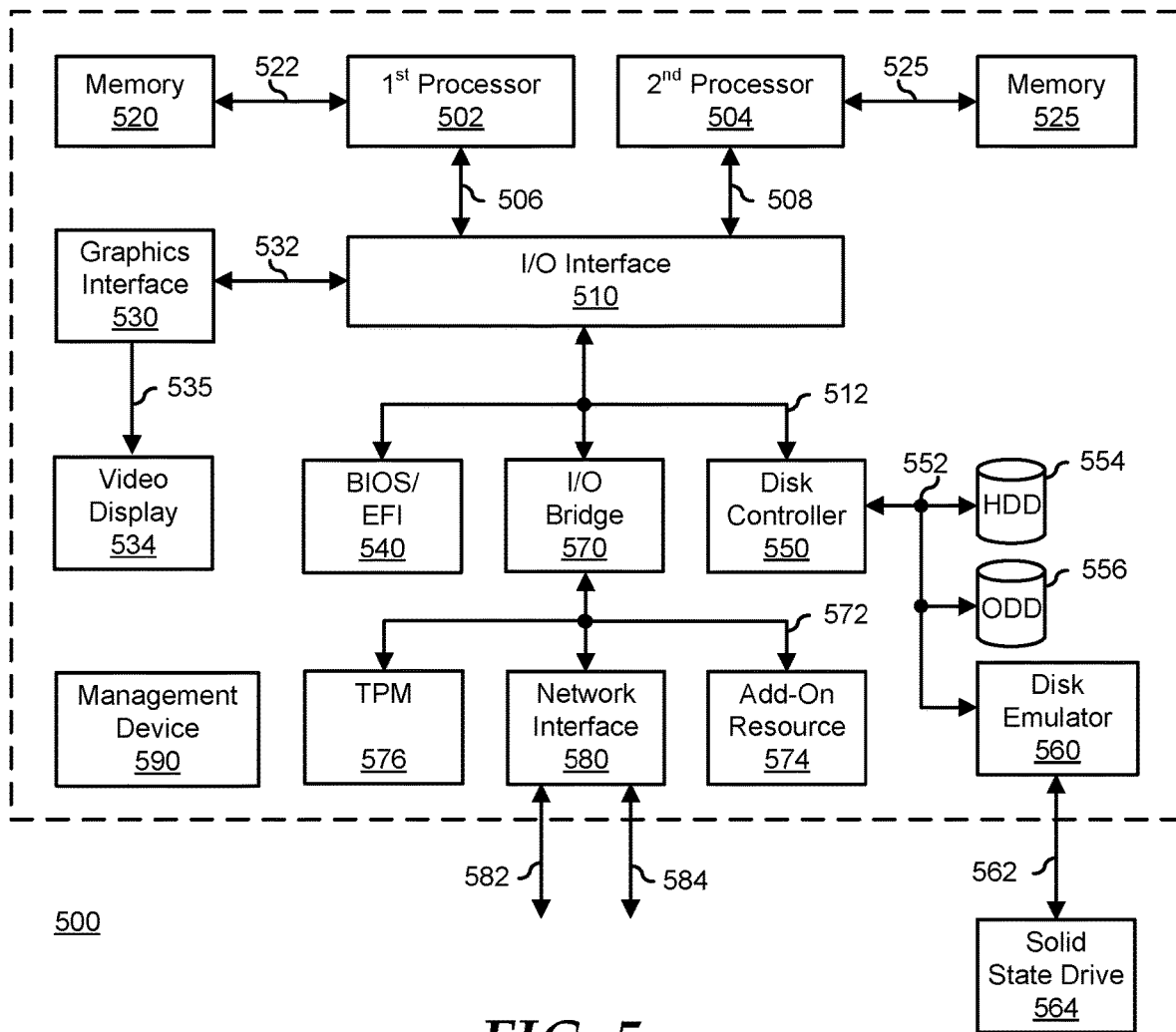
FIG. 5 is a block diagram illustrating a generalized information handling system according to another embodiment of the present disclosure.

FIG. 5 illustrates a generalized embodiment of an information handling system 500. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 500 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 500 can include processing resources for executing machine-executable code, such as a central processing unit (CPU), a programmable logic array (PLA), an embedded device such as a System-on-a-Chip (SoC), or other control logic hardware. Information handling system 500 can also include one or more computer-readable medium for storing machine-executable code, such as software or data. Additional components of information handling system 500 can include one or more storage devices that can store machine-executable code, one or more communications ports for communicating with external devices, and various input and output (I/O) devices, such as a keyboard, a mouse, and a video display. Information handling system 500 can also include one or more buses operable to transmit information between the various hardware components.

Information handling system 500 can include devices or modules that embody one or more of the devices or modules described below, and operates to perform one or more of the methods described below. Information handling system 500 includes a processors 502 and 504, an input/output (I/O) interface 510, memories 520 and 525, a graphics interface 530, a basic input and output system/universal extensible firmware interface (BIOS/UEFI) module 540, a disk controller 550, a hard disk drive (HDD) 554, an optical disk drive (ODD) 556, a disk emulator 560 connected to an external solid state drive (SSD) 562, an I/O bridge 570, one or more add-on resources 574, a trusted platform module (TPM) 576, a network interface 580, and a management device 590. Processors 502 and 504, I/O interface 510, memory 520, graphics interface 530, BIOS/UEFI module 540, disk controller 550, HDD 554, ODD 556, disk emulator 560, SSD 562, I/O bridge 570, add-on resources 574, TPM 576, and network interface 580 operate together to provide a host environment of information handling system 500 that operates to provide the data processing functionality of the information handling system. The host environment operates to execute machine-executable code, including platform BIOS/UEFI code, device firmware, operating system code, applications, programs, and the like, to perform the data processing tasks associated with information handling system 500.

In the host environment, processor 502 is connected to I/O interface 510 via processor interface 506, and processor 504 is connected to the I/O interface via processor interface 508. Memory 520 is connected to processor 502 via a memory interface 522. Memory 525 is connected to processor 504 via a memory interface 527. Graphics interface 530 is connected to I/O interface 510 via a graphics interface 532, and provides a video display output 535 to a video display 534. In a particular embodiment, information handling system 500 includes separate memories that are dedicated to each of processors 502 and 504 via separate memory interfaces. An example of memories 520 and 525 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 540, disk controller 550, and I/O bridge 570 are connected to I/O interface 510 via an I/O channel 512. An example of I/O channel 512 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 510 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/UEFI module 540 includes BIOS/UEFI code operable to detect resources within information handling system 500, to provide drivers for the resources, initialize the resources, and access the resources. BIOS/UEFI module 540 includes code that operates to detect resources within information handling system 500, to provide drivers for the resources, to initialize the resources, and to access the resources.

Disk controller 550 includes a disk interface 552 that connects the disk controller to HDD 554, to ODD 556, and to disk emulator 560. An example of disk interface 552 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 560 permits SSD 564 to be connected to information handling system 500 via an external interface 562. An example of external interface 562 includes a USB interface, an IEEE 1394 (Firewire) interface, a proprietary interface, or a combination thereof. Alternatively, solid-state drive 564 can be disposed within information handling system 500.

I/O bridge 570 includes a peripheral interface 572 that connects the I/O bridge to add-on resource 574, to TPM 576, and to network interface 580. Peripheral interface 572 can be the same type of interface as I/O channel 512, or can be a different type of interface. As such, I/O bridge 570 extends the capacity of I/O channel 512 when peripheral interface 572 and the I/O channel are of the same type, and the I/O bridge translates information from a format suitable to the I/O channel to a format suitable to the peripheral channel 572 when they are of a different type. Add-on resource 574 can include a data storage system, an additional graphics interface, a network interface card (NIC), a sound/video processing card, another add-on resource, or a combination thereof. Add-on resource 574 can be on a main circuit board, on separate circuit board or add-in card disposed within information handling system 500, a device that is external to the information handling system, or a combination thereof.

Network interface 580 represents a NIC disposed within information handling system 500, on a main circuit board of the information handling system, integrated onto another component such as I/O interface 510, in another suitable location, or a combination thereof. Network interface device 580 includes network channels 582 and 584 that provide interfaces to devices that are external to information handling system 500. In a particular embodiment, network channels 582 and 584 are of a different type than peripheral channel 572 and network interface 580 translates information from a format suitable to the peripheral channel to a format suitable to external devices. An example of network channels 582 and 584 includes InfiniBand channels, Fibre Channel channels, Gigabit Ethernet channels, proprietary channel architectures, or a combination thereof. Network channels 582 and 584 can be connected to external network resources (not illustrated). The network resource can include another information handling system, a data storage system, another network, a grid management system, another suitable resource, or a combination thereof.

Management device 590 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 500. In particular, management device 590 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 500, such as system cooling fans and power supplies. Management device 590 can include a network connection to an external management system, and the management device can communicate with the management system to report status information for information handling system 500, to receive BIOS/UEFI or system firmware updates, or to perform other task for managing and controlling the operation of information handling system 500. Management device 590 can operate off of a separate power plane from the components of the host environment so that the management device receives power to manage information handling system 500 when the information handling system is otherwise shut down. An example of management device 590 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 590 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:
1. An information handing system, comprising:
a transmitter configured to provide a differential signal on a pair of differential outputs, the transmitter including a first pull-down resistor coupled between a first one of the differential outputs and a ground plane of the information handling system, and a second pull-down resistor coupled between a second one of the differential outputs and the ground plane;
a receiver configured to receive the differential signal on a pair of differential inputs; and a differential signal channel configured to carry the differential signal from the differential outputs to the differential inputs, the differential signal is provided on the differential signal channel as a voltage swing between a first positive voltage and a first negative voltage with reference to the ground plane.

2. The information handling system of claim 1, wherein the transmitter includes a first capacitor coupled between a differential signal source and a first one of the differential outputs, and a second capacitor coupled between the differential signal source and a second one of the differential outputs.

3. The information handling system of claim 1, wherein the receiver further includes a first pull-down resistor coupled between the first differential input and the ground plane, and a second pull-down resistor coupled between the second differential input and the ground plane.

4. The information handling system of claim 3, wherein the receiver includes a first capacitor coupled between a first one of the differential inputs and a differential signal sink, and a second capacitor coupled between a second one of the differential inputs and the differential signal sink.

5. The information handling system of claim 4, wherein the receiver further includes a first pull-up resistor coupled between a first input of the differential signal sink and a positive voltage plane of the information handling system, and a second pull-up resistor coupled between a second input of the differential signal sink and the positive voltage plane.

6. The information handling system of claim 5, wherein the differential signal provided by the differential signal source is provided at a first voltage level.

7. The information handling system of claim 6, wherein the differential signal received by the differential signal sink is received as a second voltage level different from the first voltage level.

8. The information handling system of claim 1, further comprising:
   a first charge pump configured to provide a second positive voltage and a second negative voltage to the transmitter, the second positive voltage and the second negative voltage being referenced to the ground plane; and
   a second charge pump configured to provide the second positive voltage and the second negative voltage to the receiver.

9. The information handling system of claim 8, wherein providing the differential signal on the differential signal channel as the voltage swing between the first positive voltage and the first negative voltage with reference to the ground plane prevents the build up of conductive anodic filaments (CAFs) between a trace of the differential signal channel and a metal layer of a printed circuit board (PCB) that includes the differential signal channel.

10. A method, comprising:
    providing, by a transmitter of an information handing system, a differential signal on a pair of differential outputs;
    receiving, by a receiver of the information handling system, the differential signal on a pair of differential inputs; and
    carrying, by a differential signal channel of the information handling system, the differential signal from the differential outputs to the differential inputs, wherein the differential signal is provided on the differential signal channel as a voltage swing between a first positive voltage and a first negative voltage with reference to a ground plane of the information handling system;
    providing, by a first charge pump of the information handling system, a second positive voltage and a second negative voltage to the transmitter, the second positive voltage and the second negative voltage being referenced to the ground plane; and
    providing, by a second charge pump of the information handling system, the second positive voltage and the second negative voltage to the receiver.

11. The method of claim 10, further comprising:
    coupling, in the transmitter, a first capacitor between a differential signal source and a first one of the differential outputs; and
    coupling, in the transmitter, a second capacitor between the differential signal source and a second one of the differential outputs.

12. The method of claim 11, further comprising:
    coupling, in the transmitter, a first pull-down resistor between the first differential output and the ground plane; and
    coupling, in the transmitter, a second pull-down resistor between the second differential output and the ground plane.

13. The method of claim 10, further comprising:
    coupling, in the receiver, a first pull-down resistor between the first differential input and the ground plane; and
    coupling, in the receiver, a second pull-down resistor between the second differential input and the ground plane.

14. The method of claim 13, further comprising:
    coupling, in the receiver, a first capacitor between a first one of the differential inputs and a differential signal sink; and
    coupling, in the receiver, a second capacitor between a second one of the differential inputs and the differential signal sink.

15. The method of claim 14, further comprising:
    coupling, in the receiver, a first pull-up resistor between a first input of the differential signal sink and a positive voltage plane of the information handling system; and
    coupling, in the receiver, a second pull-up resistor between a second input of the differential signal sink and the positive voltage plane.

16. The method of claim 15, wherein the differential signal provided by the differential signal source is provided at a first voltage level, and wherein the differential signal received by the differential signal sink is received as a second voltage level different from the first voltage level.

17. The method of claim 10, wherein providing the differential signal on the differential signal channel as the voltage swing between the first positive voltage and the first negative voltage with reference to the ground plane prevents the build up of conductive anodic filaments (CAFs) between a trace of the differential signal channel and a metal layer of a printed circuit board (PCB) that includes the differential signal channel.

18. An information handing system, comprising:
    a printed circuit board (PCB);
    a receiver affixed to the PCB and configured to receive a differential signal on a pair of differential inputs, the receiver including a first capacitor coupled between a first one of the differential inputs and a differential signal sink, and a second capacitor coupled between a second one of the differential inputs and the differential signal sink; and a differential signal channel instantiated in the PCB and configured to carry the differential signal as a voltage swing between a first positive voltage and a first negative voltage with reference to a ground plane of the information handling system.

\* \* \* \* \*